United States Patent [19]
Schork et al.

[11] Patent Number: 6,087,615
[45] Date of Patent: Jul. 11, 2000

[54] ION SOURCE FOR AN ION BEAM ARRANGEMENT

[75] Inventors: Rainer Schork, Bammersdorf; Heiner Ryssel, Spardorf, both of Germany

[73] Assignee: Fraunhofer-Gesellschaft Zur Forderung, Munich, Germany

[21] Appl. No.: 09/117,297

[22] PCT Filed: Jan. 23, 1997

[86] PCT No.: PCT/EP97/00319

§ 371 Date: Oct. 30, 1998

§ 102(e) Date: Oct. 30, 1998

[87] PCT Pub. No.: WO97/27613

PCT Pub. Date: Jul. 31, 1997

[30] Foreign Application Priority Data

| Jan. 23, 1996 | [DE] | Germany | 196 02 283 |
| May 9, 1996 | [DE] | Germany | 196 18 733 |
| May 9, 1996 | [DE] | Germany | 196 18 734 |
| Jan. 13, 1997 | [DE] | Germany | 197 00 856 |

[51] Int. Cl.[7] .................................................. B23K 9/00
[52] U.S. Cl. ............................... 219/121.43; 219/121.52
[58] Field of Search ...................... 219/121.43, 121.52; 438/57; 204/192.11, 192.38; 250/492.2; 376/105; 216/59

[56] References Cited

U.S. PATENT DOCUMENTS

| 3,924,931 | 12/1975 | Cheo | 385/8 |
| 4,272,319 | 6/1981 | Thode | 376/105 |
| 4,346,301 | 8/1982 | Robinson et al. | 250/492.2 |
| 4,370,175 | 1/1983 | Levatter | 438/57 |
| 5,198,072 | 3/1993 | Garbriel | 216/59 |
| 5,396,076 | 3/1995 | Kimura | 250/492.21 |
| 5,902,462 | 5/1999 | Krauss | 204/192.38 |

FOREIGN PATENT DOCUMENTS

| 0 405 855 | 1/1991 | European Pat. Off. |
| 3632340 | 3/1988 | Germany |
| 3708716 | 9/1988 | Germany |

OTHER PUBLICATIONS

Patent Abstracts of Japan, 6–208837, Application No. 5–2817, E–1622 Oct. 28, 1994, vol. 18/No. 566, Plasma Drawing Grid of Ion Beam Processor, Int. Cl. H01J37/08, H01J27/02, Nippon Telegraph & Telephone Corp.

Patent Abstracts of Japan, Publication No. 08096742, Publication Date Dec. 4, 1996, Ion Implantation Device, Int. Cl. H01J37/317, Nissin Electric Co., Ltd.

Patent Abstracts of Japan, 2–20016, Jan. 23, 1990, Manufacture of Semiconductor Device, Int. Cl. H01L21/205, Seiko Epson Corp.

Patent Abstracts of Japan, 2–20017, Jan. 23, 1990, Vapor Grwoing Meethod For Rare Earth Element Added 111–V Compound Semiconductor, Int. Cl. H01L21/205, Nippon Telegraph & Telephone Corp.

Patent Abstracts of Japan, 2–20018, Jan. 23, 1990, Electrode Structure for Plasma Processor, Int. Cl. H01L21/22, M. Setetsuku K.K.

(List continued on next page.)

*Primary Examiner*—Teresa Walberg
*Assistant Examiner*—Quang Van
*Attorney, Agent, or Firm*—Dougherty & Associates

[57] ABSTRACT

An ion source for large-area implantation of ions into a specimen comprises an anode, a cathode produced from the same material as that of the specimen towards which ions are emitted from the ion source, or coated with this material, or produced from a material which does not represent a contamination for the specimen, and a closed plasma chamber arranged between the anode and the cathode, the cathode comprises a multi-slot structure with juxtaposed slots which are separated by bars or plates, the ions passing through the multi-slot structure whereby a multi-band beam is produced, and a voltage for generating an electric field at right angles to the ion beam being applicable to the cathode or to subsequent multi-slot structures for extracting and accelerating the multi-band beam, the voltage being applied in such a way that the bars have different polarities.

16 Claims, 7 Drawing Sheets

OTHER PUBLICATIONS

Patent Abstracts of Japan, 63–252341, Oct. 19, 1998, Grid, Int. Cl. H01J27/08, Nec Corp.

Patent Abstracts of Japan, 63–190228, Aug. 5, 1988, Single–Sheet Grid Member for Ion Source Device, Int. C. H01J27/08, Nippon Telegraph & Telephone Corp.

Patent Abstracts of Japan, 61–13542, Jan. 21, 1986, Ion Implantation Mask Device and Method of Implantation, Int. Cl. H01J37/317, Nippon Denshin Denwah Kosa.

Patent Abstracts of Japan, 61–13543, Jan. 21, 1986, Analysis Tube for Helium Leak Detector, H01J49/26, Shimazu Seisakusoh K.K.

Patent Abstracts of Japan, 61–13544, Jan. 21, 1986, Flash Lamp, Int. Cl. H01J61/54, Fuji Xerox K.K.

ION SOURCE FOR AN ION BEAM ARRANGEMENT

BACKGROUND OF THE INVENTION

1. Field of the Invention

The present invention refers to a device for large-area implantation of ions for an ion implantation unit.

2. Description of the Related Art

Ion sources are technically used in fields in which a large-area homogenous ion beam is required. This is the case e.g. in the fields of large-area ion implantation for doping semiconductors, tribology for surface hardening and ion beam-assisted coating. A device according to the generic clause is known from JP-A-2-20018.

In the field of ion implantation for highly integrated microelectronics there is a trend towards smaller ion energies in combination with larger implantation surfaces. The maximum integration with more than $10^7$ components per circuit requires a reduction of the pn junction depth. In CMOS technology, for example, an extremely large number of pn junctions having a depth of less than 100 nm is required for the drain and the source. The production of increasingly flatter pn junctions entails great technological difficulties especially in the case of an implantation of boron for $p^+$ regions. The requirements which have to be fulfilled by ion implantation in this connection, e.g. a low ion energy, distinctly below 30 keV, a high ion current and a high throughput, a parallel beam with large implantation areas and a high homogeneity, are not fulfilled by the commercial units which are available at present.

A further performance characteristic for future semiconductor manufacturing devices is the integrability in so-called multi-compartment process units, which are also referred to as cluster systems. This necessitates the development of small process modules which can be supplied with process wafers by a central roboter. Such systems are advantageous insofar as a plurality of process steps can be carried out in one unit. Due to the increasing number of process steps carried out in semiconductor manufacturing processes and due to the higher requirements that are to be met as far as the flexibility of the production process is concerned, such units become more and more important. Conventional implantation units are not suitable for integration in a multi-compartment process unit because their dimensions are too large. The commercial units, which become more and more complex and expensive, also require a great deal of maintenance work and a large clean-room area, and this, in turn, results in high operating expenses.

In order to fulfil the above-mentioned requirements, a new ion beam technology is necessary. One possibility is offered by the so-called "plasma immersion ion implantation", abbreviated to PIII. In such units a plasma is formed in the implantation chamber by means of high-frequency electromagnetic excitations. The ion density in this area is normally $10^{10}$ to $10^{11}$ cm$^{-3}$. By applying a negative voltage, which can amount to some kilovolts, the positive ions are accelerated from the plasma in the direction of a specimen to be processed. A PIII unit has a plurality of advantages, such as a high ion current, low processing costs, and it is a, compact system which requires little maintenance work and which is very suitable for use in multi-compartment process units.

Although the PIII process has already been known for a long time, it has not been able to gain acceptance in semiconductor-technology implantation processes up to now. The reasons for this are the diffuse energy distribution (energy contamination), the inhomogenous dose distribution and the contamination of the specimens with heavy metals or undesired kinds of ions.

Known ion sources for the generation of large-area ion beams are the high-frequency and the electron-cyclotron-resonance ion sources.

When high-frequency ion sources (RF ion sources) are used, the operating pressure is approx. $10^{-3}$ to $10^{-2}$ mbar. These ion sources are advantageous as far as their simple structural design and the small amount of power consumed are concerned. The high frequency is coupled in capacitively or inductively. If the plasma required has to be very clean, the plasma reactor used will consist of a quartz dome. The use of a quartz dome makes it more difficult to couple in the high frequency and to introduce the gas into the plasma chamber in a uniformly distributed manner. In order to avoid these disadvantages, which result in inhomogeneous ion distributions and higher operating pressures, many manufacturers use metal components in the plasma chamber. This use of metal components results, in turn, in metal contamination on the process wafers and excludes the use of this type of ion source for large-area ion implantation. The conventional large-area RF ion sources are therefore only suitable for ion etching. Since, in the case of etching, the contaminations occur on the surface, but are not implanted in the semiconductor, they can be removed.

Electron-cyclotron-resonance ion sources (ECR ion sources) show, due to the electron-cyclotron resonance, a higher plasma density ($10^{12}$ to $10^{13}$ cm$^{-3}$) than high-frequency plasmas ($10^{10}$ to $10^{11}$ cm$^{-3}$). Hence, these sources work at a lower process pressure in the range of $10^{-5}$ to $10^{-2}$ mbar. One disadvantage of ECR ion sources is the divergence of the ion beam caused by the magnetic field. Like in the case of RF sources, a quartz dome is required for reducing the contamination when ECR ion sources are used in the field of semiconductors. This has again the effect that it is more difficult to introduce the gas in a uniformly distributed manner and to couple in the microwaves. Hence, some manufacturers use metal components in the plasma chamber. The ECR sources are used for conventional ion implantation (with mass separation) and for etching processes. Up to now, it has not been possible to use them for large-area ion implantation in view of the hitherto unsolved contamination problems and in view of the high magnetic fields. In addition, the homogeneity of the plasma decreases as the size increases, since the ECR condition is only fulfilled at the boundary of the plasma in most cases. Such an ECR ion source is known e.g. from DE 3708716 A1.

A further known ion source is the so-called Kaufmann ion source, which is, however, unsuitable for many cases of use for reasons of contamination. A special problem arising when Kaufmann ion sources are used is the corrosion and the sputtering of the thermionic cathode.

In the prior art, ion beam units are known, which use so-called ion optics. Hitherto known ion optics for large-area ion beams are, however, limited to the extraction and the acceleration of ions from the plasma. These known ion optics cannot be used for deflecting a large-area ion beam without impairing the homogeneity of the ion beam and without introducing an additional contamination source into the ion beam. Since the hitherto known grids or deflection means consist of metal or graphite, the ion beam sputtering causes material to be removed, which then contaminates the semiconductor specimens. A further problem arising in connection with the hitherto used grids is that an image of the grid structure is formed on the process wafer. Extraction grids are described e.g. in DE 4315348 A1 and in DE 3601632 A1.

In the prior art implantation units are known in which an ion source is provided, which produces an ion beam that is thin in comparison with the specimen. These known implantation units comprise, in addition to the ion source, a mass separation, an acceleration tube, a deflection or raster unit and an implantation chamber. The mass separation units of these known ion implantation units consist of a so-called analysis magnet with a vacuum gap, delimited by the two poles, between which the thin ion beam emitted by the ion source passes; due to the influence of the magnets, an analysis of the ion beam takes place in such a way that specific ions within the ion beam are deflected more strongly from their trajectory due to the effect produced by the magnets so that these ions are prevented from passing through a separation slot which is arranged subsequent to the analysis region. Hence, the thin ion beam only contains the desired ions. Such ion implantation units are described e.g. in EP 0405855 A2 and in U.S. Pat. No. 5,396,076.

The disadvantage of these known implantation units is that they are not suitable for effecting large-area ion implantation so that, in these known implantation units, a complicated rastering of the specimens cannot be dispensed with. Furthermore, a large-area ion beam cannot be produced by these known implantation units and, consequently, these implantation units do not offer the possibility of deflecting such a large-area ion beam or of effecting a mass separation of such a large-area ion beam. A further disadvantage of this known ion implantation units is that they have a complicated structural design in the case of which two magnetic poles have to be provided in opposed relationship with one another for influencing the ion beam that passes between these poles. In addition, a slot structure, which allows the desired ion beam to pass, has to be provided at the output of the separation unit. The separation magnet of production units has a weight of several tons, and, consequently, it does not permit a compact and modern concept of the unit in question, e.g. multi-compartment process units.

SUMMARY OF THE INVENTION

It is therefore the object of the present invention to provide a device for large-area implantation of ions and an ion beam unit in the case of which contaminations of the process wafer can reliably be avoided, which permit large-area ion implantation of specimens and which reliably avoid the disadvantages that are caused when the plasma is arranged directly above the process wafer.

The present invention provides a device for large-area implantation of ions into a specimen, the device including an anode, a cathode produced from the same material as that of the specimen towards which ions are emitted from the ion source, or coated with this material, or produced from a material which does not represent a contamination for the specimen, and a plasma chamber arranged between the anode and the cathode. The plasma chamber is closed, and the cathode comprises a multi-slot structure with juxtaposed slots which are separated by bars, the ions passing through the multi-slot structure whereby a multi-band beam is produced. A voltage for generating an electric field at right angles to the ion beam is applicable to the cathode or to subsequent multi-slot structures for extracting and accelerating the multi-band beam, the voltage being applied in such a way that the bars have different polarities.

According to a further aspect of the present invention, a ion unit is provided which includes such a device for large-area implantation of ions into a specimen.

The advantage of the present invention is that this new kind of ion beam unit can be used for producing, extracting, deflecting and accelerating a contamination-free ion beam, the elements of the device for large-area implantation of ions, also referred to in the following description as ion source, and of the ion optics which are essential with regard to the generation, extraction, deflection and acceleration consisting of silicon according to a preferred embodiment and being therefore suitable for very clean processes in the field of silicon semiconductor technology.

The present invention is also advantageous insofar as, by means of the ion beam unit according to the present invention, the drawbacks of the known implantation units described hereinbefore are reduced or rather completely eliminated, and also insofar as an economy-priced, compact and integrable system having a high throughput and entailing low operating expenses is provided, the system being particularly suitable for implanting high doses at low energy, less than 10 keV.

Another advantage is accomplished by the fact that, by means of the new kind of ion optics, which consists e.g. of silicon, the ion beam can be extracted, accelerated and/or deflected in a contamination-free manner, without any images of a grid structure being formed on the process wafer. In addition, the shape of the ion beam can be adapted to the substrate and the process wafer, respectively, any size being possible in this case. The device according to the present invention is therefore also suitable for processing square substrates, e.g. for LCD displays.

A further advantage of the ion beam unit according to the present invention is to be seen in the fact that it is now possible to combine the advantages of plasma doping with the advantages of conventional ion implantation. A modern, efficient semiconductor manufacturing device is provided, which satisfies the requirements which are to be fulfilled in the field of ion implantation technology with regard to increasingly higher throughputs at low energy and a high dose.

Yet another advantage of the present invention is attained by the fact that a very clean plasma and, consequently, a contamination-free ion beam is produced, since the plasma chamber is e.g. completely shielded by quartz glass and silicon. In addition, an optimum high-frequency coupling is guaranteed, since the electrodes are located directly on the plasma and delimit the plasma chamber.

Yet another advantage is to be seen in the fact that a very homogeneous plasma can be produced also in the case of large areas; in contrast to other plasma sources, the homogeneity increases as the area increases, when a parallel-plate reactor is used.

A further advantage is that the shape of the ion beam can be chosen at will and can therefore be adapted to the shape of the specimen to be processed. Furthermore, contamination-free decoupling of the ions from the plasma is guaranteed by the use of a silicon grid or a slotted silicon grid. By so-called wobbling or deflection of the ion beam, the formation of an image of the grids on the process wafers is prevented Another advantage of the present invention is attained by the provision of an economy-priced, compact and integrable system having low acquisition, maintenance and operating costs.

Furthermore, the ion beam unit according to the present invention offers the advantage of a high throughput and low processing costs, whereas, when flat pn junctions are produced in conventional implantation units, the low ion energy causes a drastic reduction of the ion current and, consequently, a low throughput. The advantage of the present invention resides in the fact that, by means of the new device, it is possible to achieve very short implantation times in combination with high doses.

Yet another advantage of the ion beam unit according to the present invention is accomplished by the circumstance that an implantation module is provided, which offers completely new technological possibilities, such as the execution of several process steps in one unit, when the implantation module is combined e.g. with an annealing module.

A further advantage of the device according to the present invention is to be seen in the fact that this device is particularly suitable for cases of use requiring a large-area ion beam which can be acclerated directly (without any mass separation, deflection and focussing unit) onto the specimen.

The ion beam unit according to the present invention is also advantageous insofar as it is now possible to combine the advantages of plasma doping with the advantages of conventional ion implantation. A modern, efficient semiconductor manufacturing device is provided, which satisfies the requirements which are to be fulfilled in the field of ion implantation technology with regard to increasingly higher throughputs at low energy and a high dose.

According to a preferred further development of the present invention, a device is provided, in the case of which the multi-slot structure of the cathode and/or the subsequent multi-slot structures is/are defined by plates which are arranged parallel to one another and to which an alternating electric field can be applied.

According to one further development, a multi-slot grid structure is arranged at that end of the multi-slot structure of the cathode or of the subsequent multi-slot structures which faces the specimen, the multi-slot grid structure being arranged in such a way that the bars thereof are located in the beam path of the ion beam. This is necessary in cases where heavy ions (e.g. $Ar^+$) are to be separated from light ions (e.g. $B^+$).

BRIEF DESCRIPTION OF THE DRAWINGS

In the following, preferred embodiments of the present invention will be described in more detail on the basis of the drawings enclosed, in which:

FIG. 8a shows a top view representation of a multi-plate system according to the present invention in accordance with a further embodiment of the present invention;

FIG. 8b shows a side view of the multi-plate system of FIG. 8a; and

FIG. 8c shows an enlarged representation of the side view of FIG. 8b.

DESCRIPTION OF THE PREFERRED EMBODIMENTS

Before preferred embodiments of the present invention are described in detail hereinbelow, a short description of a conventional HF plasma source used for etching processes will first be given on the basis of FIG. 7, this conventional HF plasma source being known e.g. from JP-A-2-20018.

Figure 7:
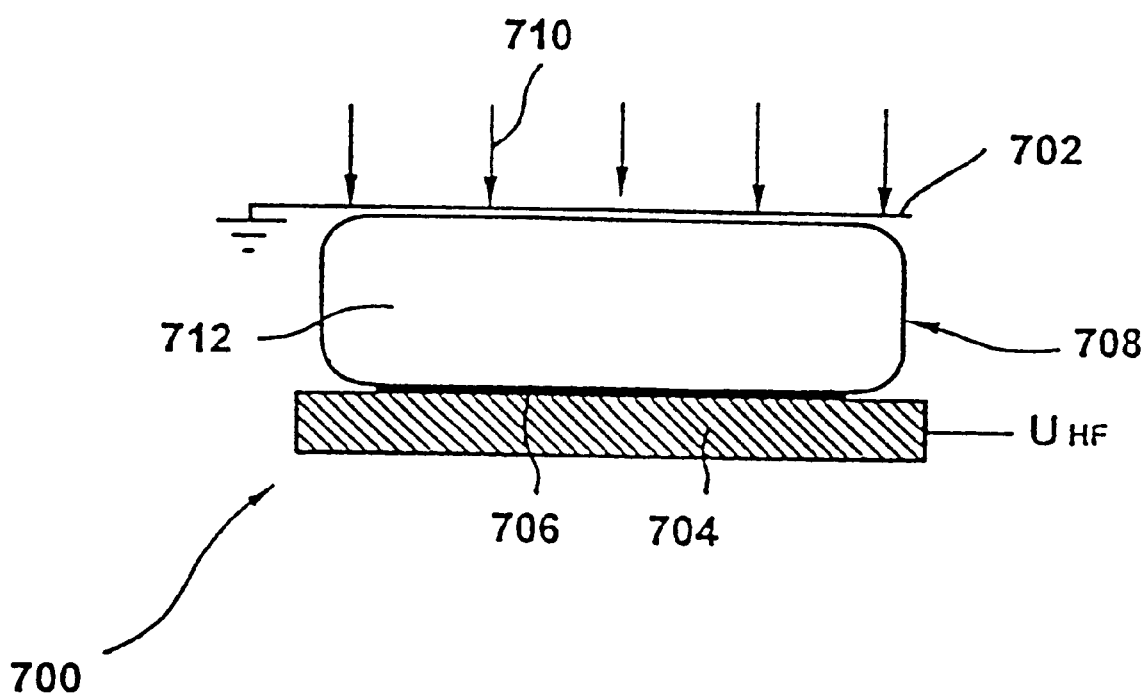
FIG. 7 shows an HF plasma source according to the prior art.

In FIG. 7, a conventional plasma source is designated generally by reference numeral 700. The HF plasma-source comprises a so-called shower electrode 702 which is connected to ground. The counterelectrode is defined by the specimen holder 704 on which a specimen 706 to be processed is arranged. Between the electrode 704 and the shower electrode 702 the so-called plasma chamber 708 is defined. In the plasma chamber 708 a plasma 712 is produced by feeding a gas into the plasma chamber 708, as indicated by arrows 710, and by applying a high-frequency voltage to the specimen holder 704.

The HF plasma source shown in FIG. 7 represents a simple way of producing a very homogenous plasma. This is achieved by applying the high-frequency voltage UHF between the shower electrode 702 and the electrode 704. This principle is often used in etching modules, the silicon wafer 706 to be etched being already placed on a metal plate electrode 704. Since the plasma 712 is formed directly over the silicon wafer 706 and since the two plate electrodes 702 (shower electrode in FIG. 7) and 704 consist of metal, radiation damage and metal contamination on the surface of the silicon wafer will occur in such a system. This kind of plasma generation can therefore only be used for etching processes or plasma-assisted layer deposition.

On the basis of FIG. 1, a first preferred embodiment of an ion optics will be described in detail hereinbelow, the ion optics cooperating with a device according to the present invention. Reference is made to the fact that in the description of the present invention following hereinbelow like reference numerals are used in the drawings to designate similar elements.

Figure 1:
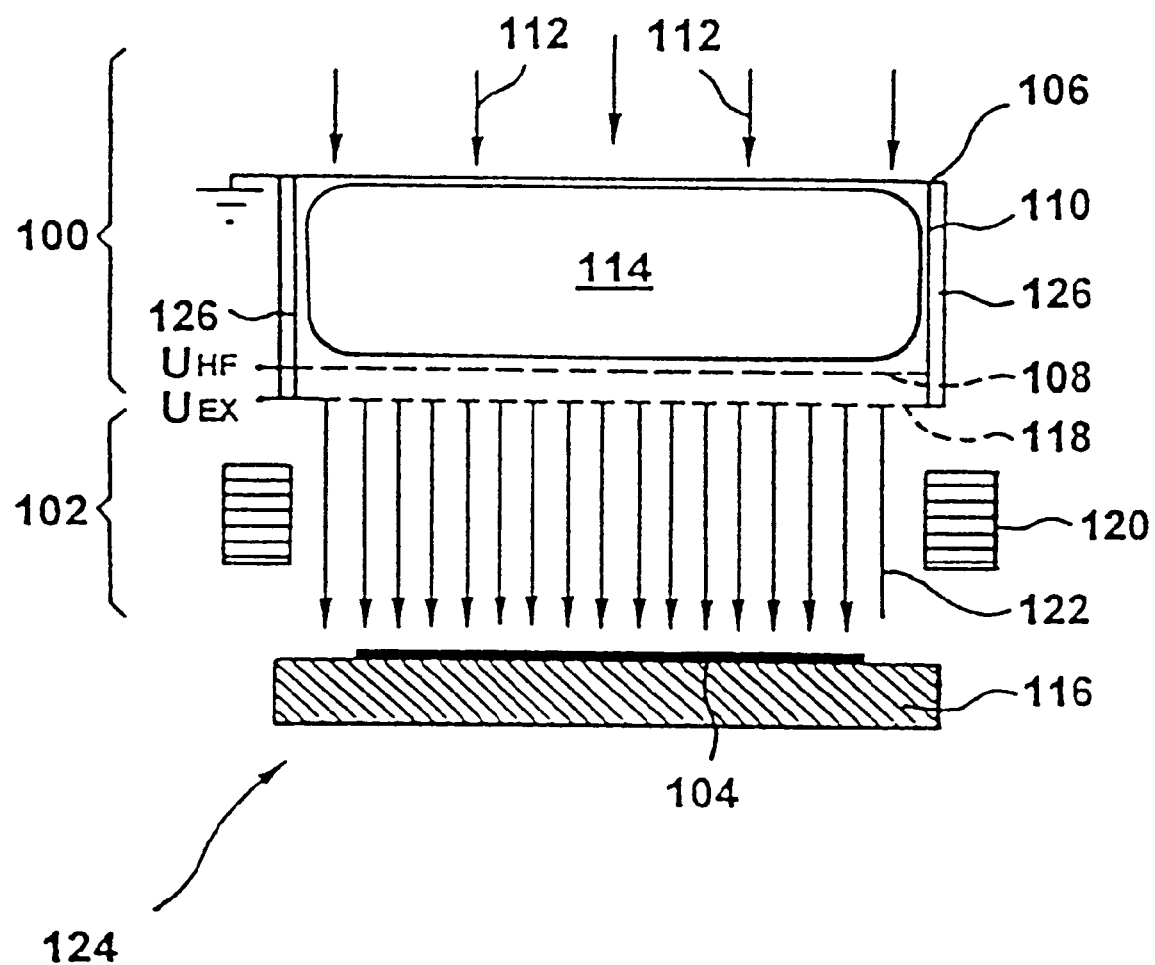
FIG. 1 shows a first embodiment of the device for large-area implantation of ions according to the present invention.

In FIG. 1, the device or ion source according to the present invention is designated generally by reference numeral 100. It is pointed out that, in addition the ion source 100 according to the present invention, also other elements of an ion beam unit are shown in FIG. 1, such as an ion optics 102 used for extracting and/or deflecting ions emitted from the ion source 100 towards a specimen 104. As can be seen in FIG. 1, the ion source 100 according to the present invention comprises an anode 106 which is connected to ground and a cathode 108 to which a high-frequency voltage UHF can be applied. Between the anode 106 and the cathode 108 a plasma chamber 110 is defined. When the ion source according to the present invention is in operation, a gas to be ionized is introduced in the plasma chamber 110, as indicated by the arrows 112 in FIG. 1. In view of the mode of introduction of the gas into the plasma chamber 110, the anode 106 is also referred to as shower electrode. It is also possible to separate the gas inlet from the anode, e.g. by an annular gas inlet between the anode and the side wall 126. For generating a plasma 114 within the plasma chamber 110, a high voltage UHF is applied to the cathode 108, which is implemented e.g. as a grid electrode.

As is clearly evident from the above description of the ion source according to the present invention, this ion source includes a so-called parallel-plate reactor provided with the additions which are described in more detail hereinbelow and which are of decisive importance. The anode and cathode, i.e. the electrodes 106, 108, according to the present invention do not consist of metal but of the same material as the specimen 104. According to the embodiment shown in FIG. 1, the electrodes 106, 108 consist of a semiconductor material, the lowermost electrode 108 being e.g. implemented in the form of a grid or having a perforated structure of a suitable nature or consisting of a silicon platelet with a plurality of slots. In addition to plasma generation, the electrode 108 can also permit extraction of the ions from the plasma chamber 110. As can be seen from FIG. 1, the plasma 114 does not burn directly above the specimen 164 but is arranged in spaced relationship therewith. Due to the use of the grid electrode 108 (or the slotted electrode), the parallel-plate reactor becomes an ion source.

As can be seen in FIG. 1, the ion optics 102 is arranged between the ion source 100 and the specimen 104 which is placed on a specimen holder 116. The ion optics 102 comprises an extraction grid 118 and an ion deflection means 120 extracting and deflecting the ions which are generated by the ion source 100 and which are emitted towards the specimen 104; this is indicated by the ion beams 122 in FIG. 1.

The extraction electrode 118 is adapted to have applied thereto an extraction voltage $U_{EX}$. Reference is made to the fact that the electrode 118 can be implemented e.g. as a grid or as a slotted electrode. The ion beams 122 are deflected with the aid of the deflection means 120. The mode of operation of the ion optics 102 will be described in more detail hereinbelow. The combination of the two main components shown in FIG. 1, viz. of the ion source 100 and of the ion optics 102 according to the present invention, represents one embodiment of the ion beam unit 124.

It is, however, pointed out that, depending on the intended use of the ion source 100, the ion optics 102 can be dispensed with fully or partly. In other words, it is for example not absolutely necessary to provide the extraction grid 118, which is shown in FIG. 1, and the ion deflection means 120, which can e.g. also be present in the form of a grid, since, on the one hand, the voltage produced in the plasma 114 between the upper and lower electrodes 106, 108 can be used for ion extraction and since, on the other hand, a voltage can be applied between the grid electrode 108 and the specimen holder 116 for the purpose of extraction.

Furthermore, it is possible to provide only a part of the ion optics together with the ion source 100, depending on the respective case of use. It is, for example, possible to dispense with the ion deflection means 120 and to provide only an extraction grid 118. If the extraction voltage is produced in the way described hereinbefore, it is, however, also possible to dispense with the extraction grid 118 and to provide only the deflection means 120.

In addition to the cathode structures described hereinbefore, the cathode 108 may also have a multi-slot structure.

As can additionally be seen in FIG. 1, the plasma chamber 110 is delimited by a non-metallic structure 126 in areas in which it is delimited neither by the anode 106 nor by the cathode 108, the non-metallic structure 126 being e.g. a quartz structure.

In the following, the ion optics 102 referred to hereinbefore will be described in greater detail on the basis of FIGS. 2 to 4. As has already been described above, the hitherto known ion optics for large-area ion beams are simple metal or graphite grids which can only be used for ion extraction and ion acceleration. These grid systems have two decisive disadvantages as far as their use in ion implantation is concerned; firstly, they are a source of contamination and, secondly, they cast a shadow, i.e. the ion beam forms an image of the grids on the specimen to be implanted.

As has already been briefly described on the basis of FIG. 1, the ion optics 102 comprises a means 118, 120 with the aid of which the ions emitted from the ion source 100 towards the specimen 104 are extracted and/or deflected. Depending on the desired application, extraction alone or deflection alone or extraction and deflection can be effected in this case.

Figure 2:
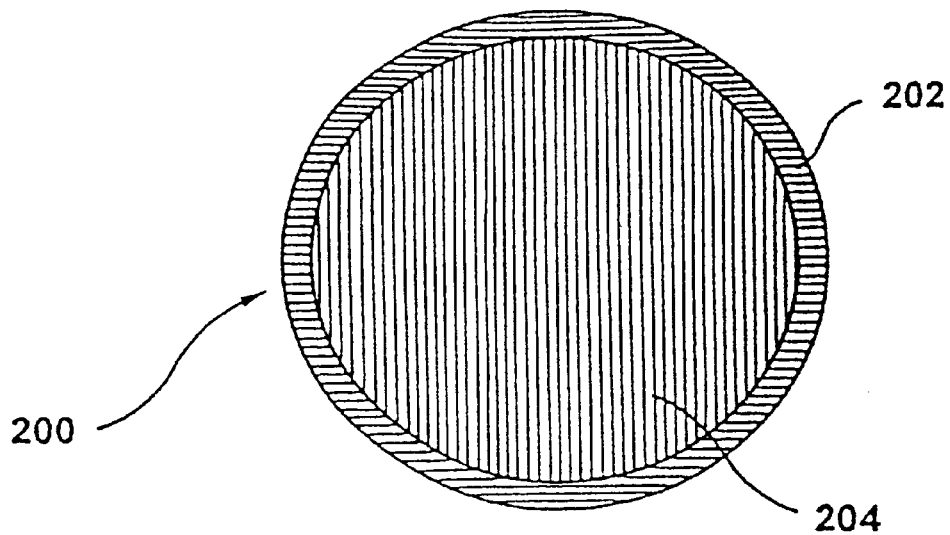
FIG. 2 shows a multi-slot grid structure.
Figure 3:
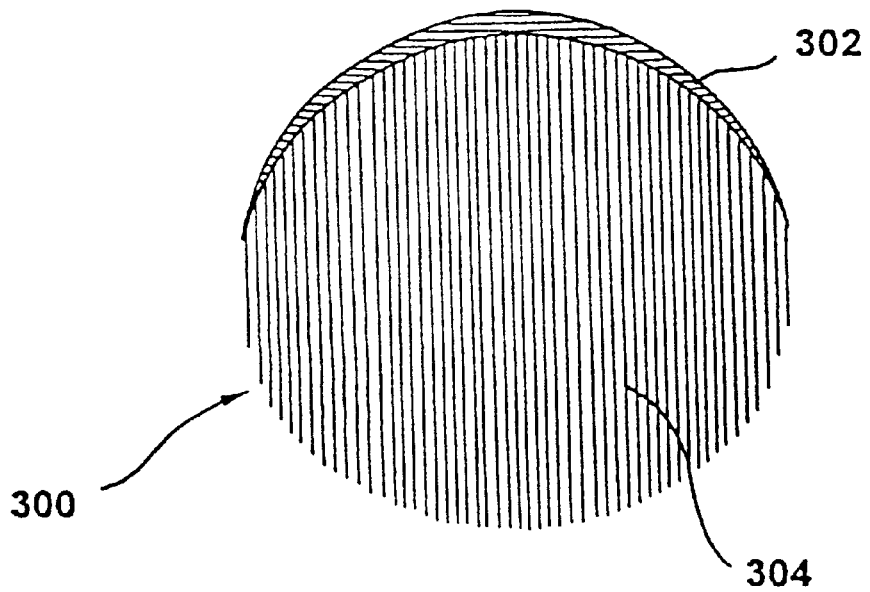
FIG. 3 shows a multi-slot grid comb structure.
Figure 4:
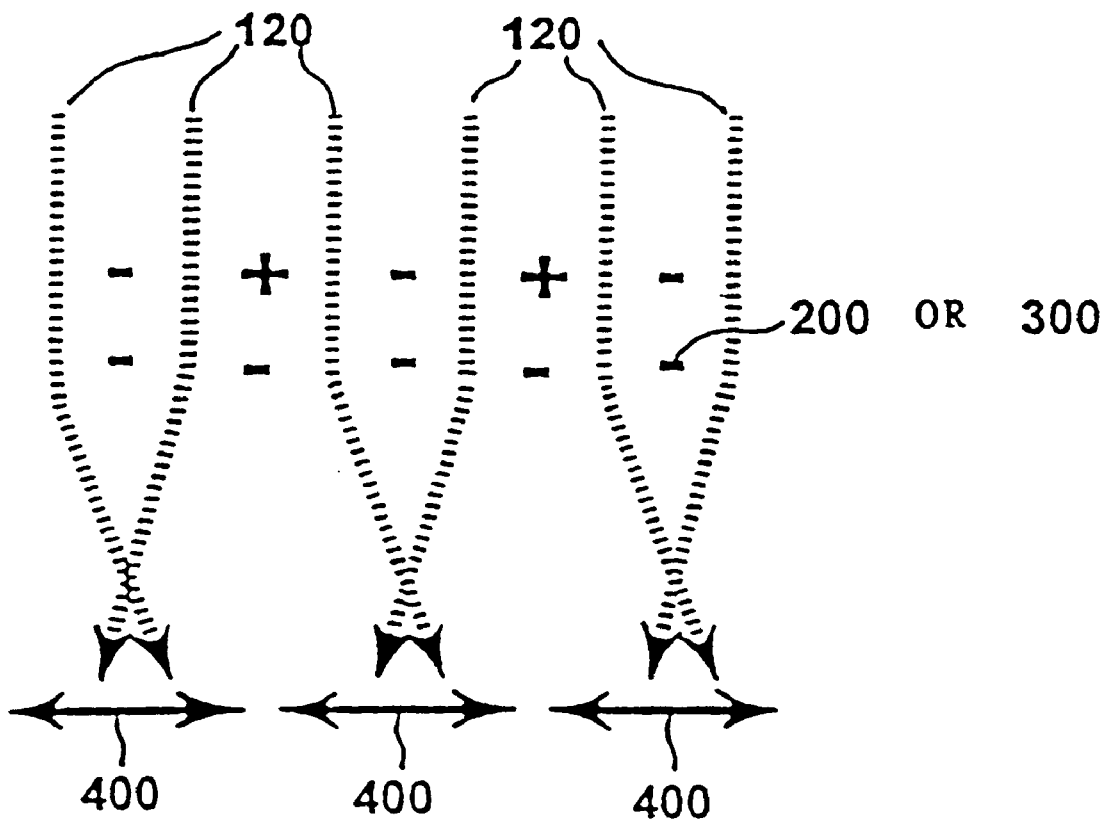
FIG. 4 shows a schematic representation of the deflection of ion beams by means of an ion optics.

FIGS. 2 and 3 show preferred embdiments of the grid structure 200 and 300 used. The ion optics 102 (FIG. 1) comprises an extraction means 118 and an ion deflection means 120. The extraction means is defined by a multi-slot grid structure 200 (FIG. 2). The grid structure 200 comprises a solid peripheral portion 202 as well as a plurality of conductive bars 204 held by the peripheral portion 202. The peripheral portion 202 is preferably produced from an insulating material so that a plurality of structures 200 can be arranged such that they are insulated from one another. Furthermore, the grid structure 200 is provided with a connection device, which is not shown in FIG. 2, so that a voltage can be applied to the bars 204.

The ion deflection means of the ion optics 102 is defined by a plurality of multi-slot grid structures which are insulated from one another. The multi-slot grid structure for the ion deflection means 120 can, for example, be formed by a plurality of superimposed multi-slot grid structures of the types shown in FIG. 2.

According to a further embodiment, a multi-slot grid structure is implemented as a comb structure, as can be seen in FIG. 3. The multi-slot grid structure 300 shown in FIG. 3 comprises a peripheral portion 302 extending around part of the outer circumference of the structure 300. Bars 304 extend from the peripheral portion 302, the bars 304 being spaced from one another and connected to the peripheral portion. The bars can be connected to a voltage source (not shown) by means of a suitable device. When a grid structure of the type shown in FIG. 3 is used, the ion deflection means 120 comprises a plurality of multi-slot grid comb structures, which are arranged such that the comb structures (in the form of the bars 304) are interleaved.

According to the present invention, the essential elements of the ion optics, which are used for extracting and/or deflecting the ion beam 120, consist of the same material as the specimen 104. The use of a multi-slot ion optics, consisting e.g. of silicon, when a silicon specimen is to be dealt with has the advantage that ion optics 120 does not constitute a contamination source for the process wafer or specimen 104, since they both consist of the same material. The material sputtered by the ion beam is e.g. silicon. When a multi-slot system is used, the ions can be extracted, accelerated and/or deflected. For this purpose, two superimposed and mutually insulated multi-slot discs 200 or two interleaved comb structures 306 are used, whereby an electric field can be produced perpendicularly to the ion beam direction and a large-area ion beam can thus be deflected without its homogeneity being impaired. This can clearly be seen in FIG. 4 where positive ion beams 120 are shown, which pass through an interleaved comb structure 300 and through superimposed flat slotted grids 200, respectively. Due to the generation of the electric field at right angles to the ion beam direction, which is shown in simplified form by indicating the polarity, the ion beams are deflected as shown by the arrows 400. It follows that the ion optics represents a kind of broad-beam wobbling means, in the present case e.g. a silicon broad-beam wobbling means, with the aid of which the formation of an image of the grid structures 200 and 300 (extraction grid, acceleration grid) on the silicon process wafer 104 is prevented in a simple manner.

One advantage of the ion optics described hereinbefore is that it is insensitive to thermal expansion and that, consequently, mechanical stress will not occur and a maladjustment will be avoided.

Another advantage is the simple production of the structures 200 and 300, respectively, which, after having been structured, are cut with the aid of a diamond saw so as to obtain suitable discs of predetermined thickness.

In the following, a further preferred embodiment of the ion beam unit 124 according to the present invention will be described with reference to FIGS. 5a and 5b; elements which have already been described on the basis of the preceding figures are provided with the same reference numerals in FIG. 5 and a renewed description has been dispensed with.

Figure 5:
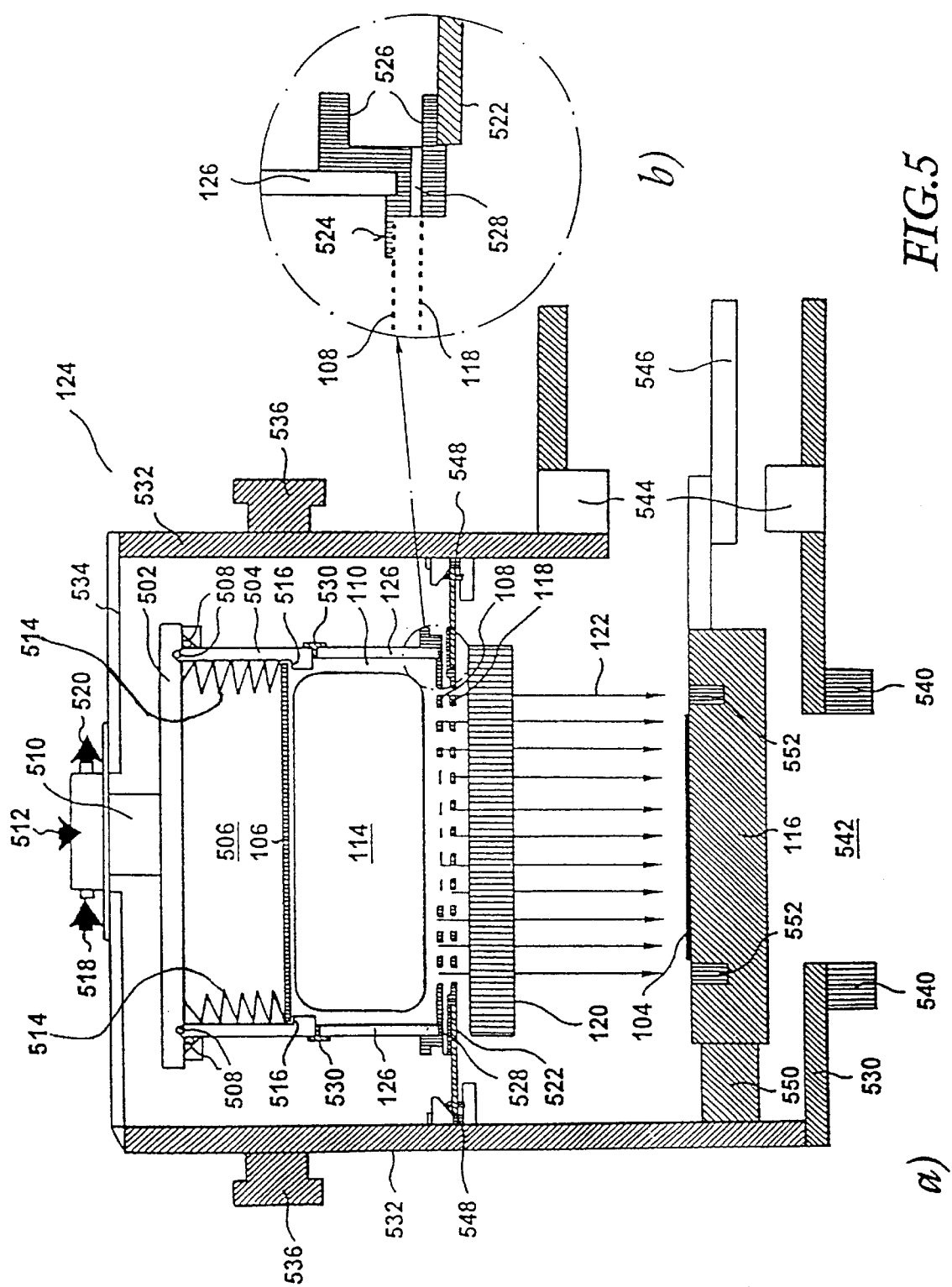
FIGS. 5a and 5b show a preferred embodiment of the ion beam unit according to the present invention.

In the ion beam unit 124 shown in FIG. 5, the plasma 114 forms in the area between a silicon anode 106 and a slotted silicon cathode 108 according to the embodiment shown in FIG. 5, the plasma chamber 110 being shielded towards the outside by quartz rings 126. Hence, the plasma 114 only comes into contact with silicon or quart surfaces, and this will prevent metal contamination. By applying a negative external d.c. voltage to the silicon extraction grid 118, positive plasma ions are extracted and accelerated onto the wafers 104 to be processed. The beam is deflected by a silicon ion optics 120 and can be focussed and defocussed e.g. by an additional pinhole aperture which is not shown.

The silicon anode 106, which is also referred to as shower anode, comprises a metal holder 502 and a quartz-ring holder 504, the anode 106, the metal holder 502 and the quart-ring holder 504 defining a closed gas distribution chamber 506.

At the connection points between the metal holder 502 and the quartz-ring holder 504, suitable sealing elements 508 are arranged by means of which the gas distribution chamber 506 is sealed off. Via a gas inlet 510, gas is introduced from a gas supply 512 into the gas distribution chamber 506. The gas distribution chamber 506 guarantees an optimum gas distribution and it also ensures that the metal holder and the silicon anode 106 are physically separated so that a complete separation of the plasma 114 from metal components is guaranteed. As can be seen from FIG. 5, the anode 106 is secured to the metal holder 502 by tungsten springs 514 and it is spring-loaded towards a projection 516 of the quartz-ring holder 504.

The gas is introduced from the gas distribution chamber 506 into the plasma chamber 510 by a plurality of uniformly distributed holes in the silicon wafer 106 or between the projection 516 and the silicon wafer 106. The metal holder 502 and the silicon anode 106 are both grounded.

The metal holder 502 is connected to a water inlet 518 and a water outlet 520, whereby water cooling of the metal holder 502 is provided.

The silicon cathode arrangement rests on a glass ring 522, which serves as a base plate and as an electric insulation. Furthermore, a silicon ring is provided, which insulates aluminium contact rings 526 and 527 from the plasma chamber 110. The aluminium contact rings 526 serve to apply the respective voltages to the electrodes 108 amd 118, as can be seen in FIG. 5b. In order to avoid a short circuit between the electrodes 108 and 118, these electrodes are insulated from one another by a teflon ring 528.

As can be seen in FIG. 5, the anode structure is connected to the cathode structure via the side walls 126 of the quartz-glass ring, the plasma chamber 110 being completely sealed off towards the outside by the quartz-ring holder 504 together with a teflon sealing 530 and the side wall 126 of the quartz-glass ring when the anode structure has been attached.

The necessary high-frequency voltage is applied to the silicon cathode 108 via the aluminium contact 526.

The ion beam 122 produced is deflected or wobbled by the ion optics 120, which has already been described hereinbefore, so that no images of the grid structures will be formed on the silicon wafer 104. In addition, a pinhole aperture can be provided by means of which the ion beam is slightly broadened or focussed, the pinhole aperture being not shown in FIG. 5. By the application of a voltage to a further slotted grid, which is not shown either, and to the specimen holder 116, respectively, the desired energy of the ion beam is established so that the acceleration voltage is decoupled from the extraction voltage and can be chosen freely within wide ranges. In this embodiment, the specimen holder 116 is covered with silicon so as to avoid contamination by sputtering.

The hitherto described arrangement is arranged in a vacuum housing having water-cooled side walls 532 as well as a vacuum cover 534. The side walls are provided with flanges 536 which can be used as observations windows, voltage and measurement bushings.

A bottom 538 of the housing comprises two flanges 540 between which an opening 542 is formed, the flanges 540 permitting the housing to be connected to a vacuum pump. On one side wall 532 of the housing a vacuum valve 544 is provided, which permits the use of a roboter means 546 for charging the ion beam unit with a wafer to be processed. The ion source is secured to the side wall 532 by means of the glass ring 522 via suitable fastening elements 548. Also the specimen holder 116 is secured to the side wall 532 of the housing by means of an insulated suspension 550.

The specimen holder 116 has integrated therein a plurality of Faraday collectors 552. By means of these collectors 552 the ion current and the homogeneity of the ion beam during the process can be measured. By integrating the ion current over the process time, the ion dose can be determined, which is an important characteristic quantity in the ion implantation process.

In the following, a dose measurement unit will be described in more detail on the basis of FIG. 6. Elements which have already been described on the basis of the preceding figures are provided with the same reference numerals in FIG. 6 and a detailed description of these elements has been dispensed with.

Figure 6:
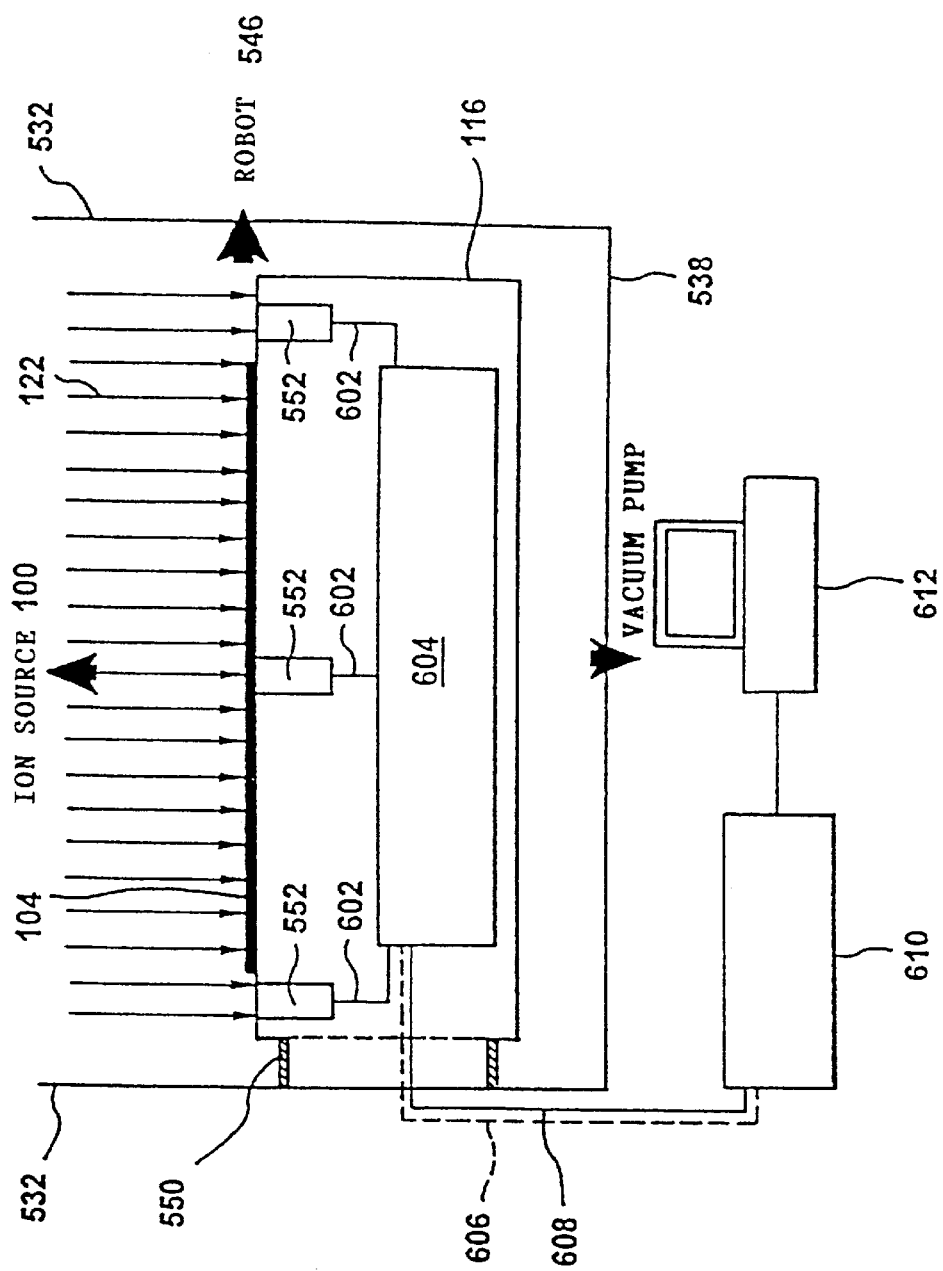
FIG. 6 shows a preferred embodiment of an integrated dose measurement system in the ion beam unit according to the present invention.

The integrated dose measurement is carried out by means of a plurality of Faraday collectors 552 which are arranged in the process wafer holder 116, as can be seen in FIG. 6. These Faraday collectors are used for measuring the ion current and the homogeneity of the ion beam during the process or between the individual process steps. By integrating the ion current over the process time, the ion dose can be determined, which is an important characteristic quantity in an ion implantation process.

As can be seen in FIG. 6, the individual Faraday collectors 552 are connected via lines 602 with a measuring amplifier 604 arranged within the holder 116. The measuring amplifier is connected to a dose measurement unit 610 via a data line 606 and an energy line 608. The dose measurement unit comprises a control, a dose display, a power supply unit and it provides an interface with the measurement current amplifier and with a control computer 612. The control computer 612 is used for controlling the dose measurement device and, in addition, also for controlling the ion beam unit shown in FIG. 5.

As can be seen in FIG. 6, the connection between the measuring amplifier and dose measurement devices is established by means of the lines 606 and 608, which are conducted through an insulated bushing in the suspension 550 by means of which the wafer holder 116 is secured to a side wall 632. The interior of the wafer holder 116 is isolated from the vacuum prevailing in the interior of the housing 532.

The current integrator shown in FIG. 6 consists of a plurality of Faraday collectors 552 and of one or more amplifier units 604 at each Faraday collector, the amplifier unit(s) being at a high-voltage potential and both components being integrated in the holder 116. As has already been described hereinbefore, a dose measurement device and a computer are provided.

The amplifier signal is passed on to the dose measurement device via an optical waveguide and, in the dose control, the signal is integrated over the process time and converted into the dose. When a preset dose has been reached, the implantation process is switched off by the control via the control computer 612. The dose control can be set manually or via the control computer 612. Since a plurality of collectors are arranged symmetrically at the boundary of the implantation surface, a measure of the homogeneity is obtained via the deviation of the individual measured values during the process. When the wafer is exchanged, i.e. when the roboter 546 (FIG. 5) removes the wafer 104 and fetches a new wafer, a precise homogeneity determination can be carried out with the aid of one or several further collectors, which are covered by the silicon wafer during the process, directly at the location at which the wafer is supported on the holder.

The advantage of the dose measurement system described above is to be seen in the fact that the measurement of the dose takes place directly at the silicon wafer and that the measurement of the beam homogeneity is carried out, without any mechanically moving parts, directly at the location at which the wafer is supported on the holder. The dose measurement system described is interference-proof to a high degree, since the measurement signal is amplified directly after the collector 552 and is only then passed on to a dose control.

The system is also advantageous insofar as the Faraday collector and the amplifier are galvanically separated from the dose control and can therefore be at different potentials. This permits the dose to be measured even if the Faraday collector is at 20 kV and the control at ground potential.

Although the specimens referred to in the above description of the preferred embodiments of the present invention are preferably specimens consisting of silicon, it is pointed out that, instead of the silicon described, also specimens consisting of other materials, such as gallium arsenide or germanium or the like, can be used; in order to avoid contamination of the process wafer to be treated, the above described elements of the ion source and of the ion beam unit consist, in this case, of the same material as the specimen to be processed, or of a material which does not represent a contamination for the specimen, such as Si or C in the case of an SiC specimen.

Figure 8:
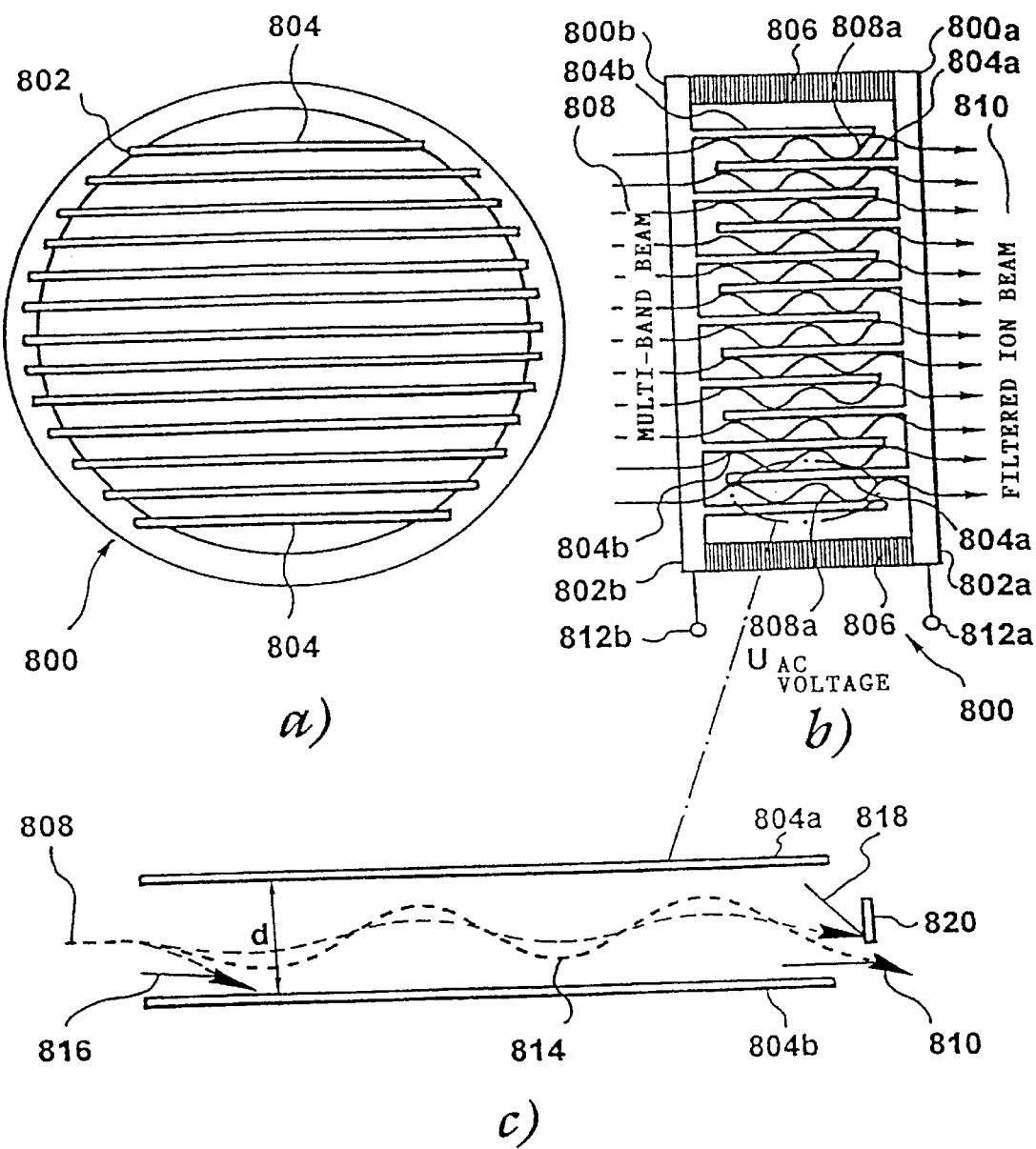

In the following, an embodiment of a component of a multi-band beam system for a simple mass separation of a large-area ion beam is shown on the basis of FIG. 8.

In FIG. 8a, a multi-slot structure 800 is shown, which comprises an aluminium contact ring 802 as well as a plurality of plates 804 arranged in parallel to one another. The plates 804 are connected to the aluminium contact ring 802 at opposite ends thereof. Either the plates 804 themselves are produced from a conductive material or they are coated with a conductive layer (not shown) so that an alternating electric field can be applied between the individual plates. In order to avoid contaminations, the material of the plates should, if possible, correspond to the material of the specimen to be implanted, or the plates should be coated with this material.

In FIG. 8b a side view of the multi-plate system 800 is shown. As can be seen in FIG. 8b, the multi-plate system 800 is defined by a first subcomponent 800a and a second subcomponent 800b according to a preferred embodiment of the present invention. The subcomponents 800a and 800b are insulated from one another by insulators 806. The insulators 806 also serve to adjust a predetermned distance between the components 800a and 800b. According to a preferred embodiment, the insulators or spacers 806 can be produced from teflon.

As can be seen in FIG. 8b, each of the subcomponents 800a and 800b comprises an aluminium contact ring 802a and 802b; in this connection, reference is, however, made to the fact that the use of an aluminium contact ring is not absolutely necessary. Also other conductive materials can be used. Furthermore, the contact structures 802a and 802b can also be produced from a non-conductive material which is covered with a conductive layer either fully or partly. The contact rings 802a and 802b have arranged threon the individual plates 804a and 804b. As has already been stated hereinbefore, the plates 804a and 804b can consist either of a conductive material or of a non-conductive material which is covered with a conductive layer. The subcomponents 800a and 800b are implemented such that the plates are arranged parallel to one another and extend from the contact rings in the same direction. This results in the comb structure of the subcomponents 800a and 800b shown in FIG. 8b. The subcomponents 800a and 800b are arranged relative to one another in such a way that the plates 804a of the first subcomponent 800a are inserted between the plates 804b of the second subcomponent 800b in such a way that a predetermined distance is established between the now neighbouring plates 804a and 804b.

A multi-band beam 808 is discharged from the ion source and enters the arrangement 800 and the individual subbeams 808a pass through between the parallel plates 804b and 804a of the two subcomponents 800b and 800a, and, in the area in which the plates 804a and 804b extend in opposed relationship with one another, the subbeams are influenced by an alternating field applied to the unit 800 so that at the exit of the arrangement 800 a filtered broad beam 810 is obtained, which is directed at the specimen. The alternating field between the plates 804a and 804b is generated by applying an alternating voltage to the connections 812a of the first subcomponent 800a and 812b of the second subcomponent 800b.

The comblike structure of the arrangement 800 shown in FIG. 8b only represents a preferred embodiment of the present invention. It is pointed out that also other embodiments are possible; the two subcomponents 800a and 800b, which have an electric voltage applied thereto, can, for example, be replaced by only one component; in this case, two connections must be provided for applying an electric voltage thereto. For effecting a mass separation by means of such an arrangement, it will be necessary that the plates of the arrangement are connected alternately to the first connection in one case and to the second connection in another case for applying the alternating voltage and that the neighbouring plates are insulated from one another so as to produce the necessary alternating field between the plates.

In the following, the functional principle underlying the present invention will be explained in more detail on the basis of FIG. 8c which shows an enlarged representation of a detail of the arrangement 800.

In FIG. 8c, a plate 804a of the first subcomponent 800a and a plate 804b of the second subcomponent 800b are shown, the plates having applied thereto an alternating electric field. An ion beam of the multi-band beam 808 enters between the plates 804a and 804b, passes between the plates 804a and 804b, and, in so doing, it is influenced by the alternating electric field so that a filtered ion beam 810 will emerge at the exit of the plates 804a and 804b. In the embodiment shown in FIGS. 8b and 8c, the plates 804a and 804b are made from silicon so as to prevent a silicon specimen, which is to be acted upon by the ion beam, from being contaminated by particles escaping from the plates.

Where, in the manner shown in FIG. 8c, a single band or ion beam 814 is passed between the plates 804a and 804b which are insulated from one another, this band or ion beam 814 can be forced onto wave paths by the alternating electric field applied between the plates 804a, 804b; this is also referred to as wobbling.

The amplitude of the deflection Y of the band or ion beam depends on the frequency f of the alternating voltage, the distance d between the plates, the amplitude of the alternating voltage $U_0$, and the mass m and the charge q of the ions, as expressed by the following equation:

$$Y = \frac{U_0 \cdot q}{d \cdot m \cdot 4 \cdot \pi^2 \cdot f^2}$$

Due to the alternating voltage applied, a lighter ion 816, e.g. $H^+$, is deflected more strongly than a heavier ion 818, e.g. $P^+$, as can be seen in FIG. 8c. When the distance d between the plates is chosen such that it is smaller than the deflection of the light ion but larger than the deflection of the heavy ion, the light ion will be separated from the heavy ion due to impacts with the plates 804a and 804b. In this way, it is, for example, possible to use $PH_3$ as a plasma gas and to filter out the hydrogen by means of the multi-plate system according to the present invention.

According to a further preferred embodiment of the present invention, a slotted grid 820 can be arranged at the exit of the multi-plate system, i.e. at the end of the multi-plate system facing the specimen. Reference numeral 820 designates in FIG. 8c a bar of the multi-slot grid, which is made e.g. of silicon. By arranging the silicon multi-slot grid at the exit of the multi-plate system and by providing a predefined bar width, also heavier ions, such as $Ar^+$, which is often used as a carrier gas, can be separated from lighter ions, such as $B^+$ or $P^+$, as can be seen in FIG. 8c at reference numeral 818.

In addition to mass separation, the the multi-plate system according to the present invention provides the further advantage that, in contrast to cases in which a structure consisting of only one multi-slot grid is used, the wobbling effected in order to avoid a formation of grid images can be carried out at lower wobbling voltages, since the ion which moves along its trajectory is exposed to the electric field transverse to the direction of flight for a longer period of time.

What is claimed is:

1. A device for large-area implantation of ions into a specimen, comprising:
   an anode;
   a cathode produced from the same material as that of the specimen towards which ions are emitted from an ion source, or coated with this material, or produced from a material which does not represent a contamination for said specimen, and
   a plasma chamber arranged between said anode and said cathode;
   wherein the plasma chamber is closed;
   wherein the cathode comprises a multi-slot structure with juxtaposed slots which are separated by bars, the ions passing through said multi-slot structure whereby a multi-band beam is produced; and
   wherein a voltage for generating an electric field at right angles to the ion beam is applicable to the cathode or to subsequent multi-slot structures for extracting and accelerating the multi-band beam, said voltage being applied in such a way that adjacent bars have different potentials.

2. A device according to claim 1, wherein the multi-slot structure of the cathode and the subsequent multi-slot structures are defined by a plurality of multi-slot grid structures which are insulated from one another.

3. A device according to claim 1, wherein the multi-slot structure of the cathode and the subsequent multi-slot structures are defined by a plurality of superimposed multi-slot grid structures.

4. A device according to claim 2, wherein the multi-slot structure of the cathode and the subsequent multi-slot structures comprise a plurality of multi-slot grid structures having a comb structure, said multi-slot grid comb structures being interleaved.

5. A device according to claim 1, wherein, at least in the case of reactive gases, also the anode is produced from the same material as that of the specimen, or is produced from a material which does not represent a contamination for the specimen.

6. A device according to claim 1, wherein in the areas in which the plasma chamber is delimited neither by the anode nor by the cathode, said plasma chamber is delimited by a non-metallic structure, such as a quartz structure, whereby an additional inductive high-frequency coupling is permitted.

7. A device according to claim 1, further comprising a gas inlet which is effectively connected to a gas distribution chamber, said gas distribution chamber being separated from the plasma chamber by the anode.

8. A device according to claim 1, wherein the multi-slot structure of the cathode and the subsequent multi-slot structures are defined by plates which are arranged parallel to one another and to which an alternating voltage can be applied for generating an alternating electric field, whereby light ions can be filtered out of the multi-band beam.

9. A device according to claim 8, firther comprising a multi-slot grid structure which is arranged at that end of the multi-slot structure of the cathode or of the subsequent multi-slot structures which faces the specimen, said multi-slot grid structure being arranged in such a way that the bars thereof are located in the beam path of the ion beam, whereby lighter and heavier ions can be separated from the desired ions in the multi-band beam.

10. A device according to claim 8, wherein the multi-slot structure of the cathode and the subsequent multi-slot structures comprise a plurality of multi-slot grid structures having a comb structure, said multi-slot grid comb structures being interleaved.

11. An ion beam unit comprising a device for large-area implantation of ions into a specimen, said device comprising:

an anode;

a cathode produced from the same material as that of the specimen towards which ions are emitted from an ion source, or coated with this material, or produced from a material which does not represent a contamination for said specimen, and a plasma chamber arranged between said anode and said cathode;

wherein the plasma chamber is closed;

wherein the cathode comprises a multi-slot structure with juxtaposed slots which are separated by bars, the ions passing through said multi-slot structure whereby a multi-band beam is produced; and wherein a voltage for generating an electric field at right angles to the ion beam is applicable to the cathode or to subsequent multi-slot structures for extracting and accelerating the multi-band beam, said voltage being applied in such a way that adjacent bars have different potentials.

12. An ion beam unit according to claim 11, further comprising a specimen holder for receiving thereon the specimen.

13. An ion beam unit according to claim 11, further comprising a dose measurement unit for measuring the dose of the ion beam emitted by the ion source and the homogeneity of said ion beam.

14. An ion beam unit according to claim 13, wherein the dose measurement unit comprises Faraday collectors.

15. An ion beam unit according to claim 13, wherein the dose measurement unit is integrated in the specimen holder, and an in situ dose and homogeneity measurement can be carried out.

16. An ion beam unit according to claim 11, wherein the specimen consists of silicon.

* * * * *